(12) United States Patent
Lee et al.

(10) Patent No.: US 8,704,100 B2
(45) Date of Patent: Apr. 22, 2014

(54) HEAT DISSIPATING SUBSTRATE AND METHOD OF MANUFACTURING THE SAME

(75) Inventors: Sang Youp Lee, Seoul (KR); Joung Gul Ryu, Seoul (KR); Dong Sun Kim, Gyunggi-do (KR); Jae Hoon Choi, Gyunggi-do (KR); In Ho Seo, Gyunggi-do (KR)

(73) Assignee: Samsung Electro-Mechanics Co., Ltd, Gyunggi-Do (KR)

( * ) Notice: Subject to any disclaimer, the term of this patent is extended or adjusted under 35 U.S.C. 154(b) by 472 days.

(21) Appl. No.: 12/717,855

(22) Filed: Mar. 4, 2010

(65) Prior Publication Data

US 2011/0114369 A1    May 19, 2011

(30) Foreign Application Priority Data

Nov. 16, 2009    (KR) .......................... 10-2009-0110480

(51) Int. Cl.
*H05K 1/00*    (2006.01)

(52) U.S. Cl.
USPC ............ 174/252; 174/250; 174/547; 174/548

(58) Field of Classification Search
USPC .................................. 174/252, 250, 547, 548
See application file for complete search history.

(56) References Cited

U.S. PATENT DOCUMENTS

| 4,943,468 A * | 7/1990 | Gordon et al. ................. 428/210 |
| 5,232,548 A * | 8/1993 | Ehrenberg et al. .............. 216/18 |
| 2009/0026604 A1* | 1/2009 | Shin et al. ..................... 257/702 |

* cited by examiner

*Primary Examiner* — Timothy Thompson
*Assistant Examiner* — Andargie M Aychillhum
(74) *Attorney, Agent, or Firm* — Bracewell & Giuliani LLP; Brad Y. Chin

(57) ABSTRACT

Disclosed herein is a heat dissipating substrate, including: a heat dissipating circuit layer formed of an electrolytic invar layer including an invar layer and electrolytic copper plating layers formed on both sides of the invar layer; insulation layers formed on both sides of the heat dissipating circuit layer such that the heat dissipating circuit layer is interposed between the insulation layers; first and second circuit layers formed on the insulation layers; and a first bump connecting the heat dissipating circuit layer with the first circuit layer and a second bump connecting the heat dissipating circuit layer with the second circuit layer. The heat dissipating substrate exhibits excellent heat dissipation efficiency and can be made thin.

2 Claims, 6 Drawing Sheets

HEAT DISSIPATING SUBSTRATE AND METHOD OF MANUFACTURING THE SAME

CROSS REFERENCE TO RELATED APPLICATION

This application claims the benefit of Korean Patent Application No. 10-2009-0110480, filed Nov. 16, 2009, entitled "Heat-dissipating substrate and fabricating method of the same", which is hereby incorporated by reference in its entirety into this application.

BACKGROUND OF THE INVENTION

1. Technical Field

The present invention relates to a heat dissipating substrate and a method of manufacturing the same.

2. Description of the Related Art

As electronic components have been becoming miniaturized, densified and thinned, thinned and highly-functionalized semiconductor package substrates are being required.

Particularly, in order to realize a multi-chip package (MCP) technology for stacking and mounting several semiconductor chips on one substrate or a package on package (PoP) technology for stacking several substrates mounted with a semiconductor chip, it is required to develop a substrate exhibiting a thermal expansion behavior similar to that of a semiconductor and having excellent bendability. Further, as the operation speed of a semiconductor chip increases due to advances in semiconductor chips, it is also required to solve the problem of heat generation.

In order to meet the above requirements, technologies for manufacturing a metal core substrate by inserting metal into a core are being used. The reason for this is that metal serves to block the thermal expansion behavior of a substrate and promote heat dissipation because it has very excellent thermal expansion characteristics and high thermal conductivity.

FIGS. 1 to 5 are sectional views showing a conventional method of manufacturing such a metal core substrate. The conventional method of manufacturing a metal core substrate is described as follows with reference to FIGS. 1 to 5.

First, as shown in FIG. 1, a metal core 11 having high thermal conductivity is provided.

Subsequently, as shown in FIG. 2, through-holes 12 are formed in the metal core 11 by drilling work using a CNC drill or a $CO_2$/YAG laser or by etching work.

Subsequently, as shown in FIG. 3, an insulation layer 13 is formed on both sides of the metal core 11 provided with the through-holes 12.

Subsequently, as shown in FIG. 4, viaholes 14 for making interlayer connections are formed by machining the insulation layer 13 corresponding to the through-holes 12 formed in the metal core 11. In this case, the viaholes 14 must have smaller sizes than the through-holes 12 formed in the metal core 11 in order to insulate copper plating layers formed on the inner walls of the viaholes 14 from the metal core 11.

Finally, as shown in FIG. 5, copper plating layers are formed on the surface of the insulation layer 13 and the inner walls of the viaholes 14 by electroless and electrolytic copper plating processes and an electrolytic plating process, and then the copper plating layers are formed into circuit layers by exposure, development and etching processes to manufacture a metal core substrate 10.

However, such a conventional method of manufacturing a metal core substrate is problematic as follows.

First, in order to prevent the electrical defect of the metal core substrate 10 due to the short of the plating layers formed on the surface of the insulation layer 13 and the inner walls of the viaholes 14 formed in the metal core 11, the through-holes 12 must be formed to have a sufficient size. In this case, the residual ratio of the metal core to the substrate is at most about 50%, thus reducing thermal conductivity. Further, in order to perform drilling work such that the sizes of the viaholes 14 are smaller than those of the through-holes 12, working accuracy is required, thus increasing manufacturing cost and time.

Furthermore, the metal core 11 is embedded in the insulation layer 13 in order to increase the rate of heat radiation, so that the thickness of the substrate is increased, with the result that, at the time of performing drilling work, a drill bit is easily worn compared to other substrates having the same structure, and working accuracy is also decreased.

SUMMARY OF THE INVENTION

Accordingly, the present invention has been made keeping in mind the above problems occurring in the prior art, and an object of the present invention is to provide a heat dissipating substrate which can increase heat dissipation efficiency and can be made thin, and a method of manufacturing the same.

An aspect of the present invention provides a heat dissipating substrate, including: a heat dissipating circuit layer formed of an electrolytic invar layer including an invar layer and electrolytic copper plating layers formed on both sides of the invar layer; insulation layers formed on both sides of the heat dissipating circuit layer such that the heat dissipating circuit layer is interposed between the insulation layers; first and second circuit layers formed on the insulation layers; and a first bump connecting the heat dissipating circuit layer with the first circuit layer and a second bump connecting the heat dissipating circuit layer with the second circuit layer.

The heat dissipating layer may further include: a first outer insulation layer and a first outer circuit layer formed on one side of the insulation layer including the first circuit layer formed thereon; and a second outer insulation layer and a second outer circuit layer formed on one side of the insulation layer including the second circuit layer formed thereon.

Another aspect of the present invention provides a method of manufacturing a heat dissipating substrate, including: forming a first bump on one side of a first metal layer, and then forming a first insulation layer on the first metal layer such that the first bump pierces the first insulation layer; forming a metal foil, which is an electrolytic invar layer including an invar layer and electrolytic copper plating layers formed on both sides of the invar layer, on the first insulation layer such that the metal foil is brought into contact with the metal bump, and then patterning the metal foil to form a heat dissipating circuit layer; forming a second bump on the heat dissipating circuit layer, forming a second insulation layer on the heat dissipating circuit layer such that the second bump pierces the second insulation layer, and then forming a second metal layer on the second insulation layer such that the second metal layer is brought into contact with the second bump; and forming plating layers on the first metal layer and the second metal layer, and then patterning the plating layers to form a first circuit layer and a second circuit layer.

In the method, each of the first metal layer and the second metal layer may have a structure in which electrolytic copper plating layers are formed on both sides of an invar layer.

Further, the method of manufacturing a heat dissipating substrate may further include, between the forming of the second metal layer and the forming of the first and second circuit layers: removing the invar layers of the first metal layer and the second metal layer and the electrolytic copper plating layers formed on the invar layers and exposed to the outside.

Further, the method of manufacturing a heat dissipating substrate may further include, after the forming of the first and second circuit layers: forming a first outer insulation layer on the first insulation layer, and forming a second outer insulation layer on the second insulation layer; and forming a first outer circuit layer connected with the first circuit layer on the first outer insulation layer, and forming a second outer circuit layer connected with the second circuit layer on the second outer insulation layer.

Various objects, advantages and features of the invention will become apparent from the following description of embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe the best method he or she knows for carrying out the invention.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
FIGS. 1 to 5 are sectional views showing a conventional method of manufacturing such a metal core substrate.
Figure 2:
Figure 3:
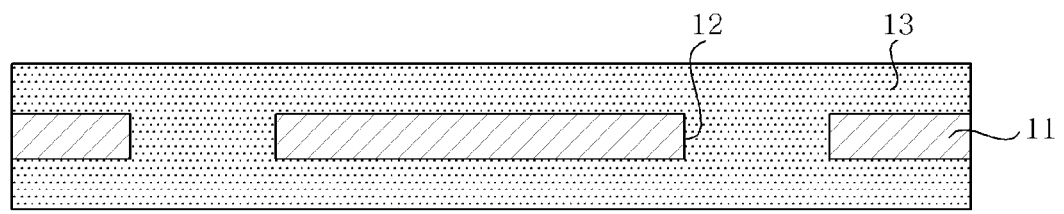
Figure 4:
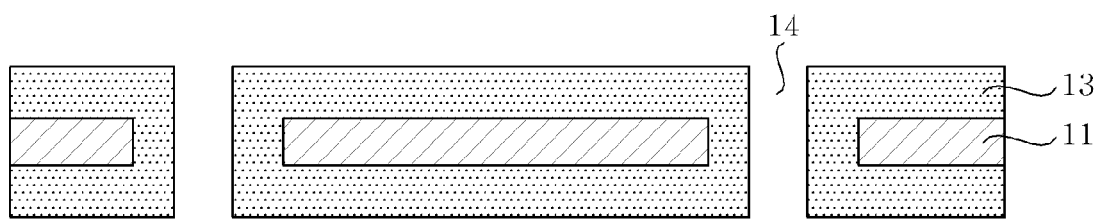
Figure 5:
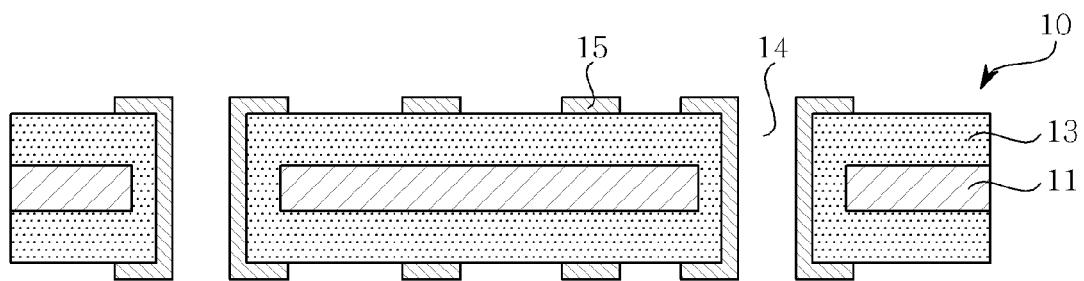

The objects, features and advantages of the present invention will be more clearly understood from the following detailed description and preferred embodiments taken in conjunction with the accompanying drawings. Throughout the accompanying drawings, the same reference numerals are used to designate the same or similar components, and redundant descriptions thereof are omitted. In the following description, the terms "first", "second" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the attached drawings.

Figure 6:
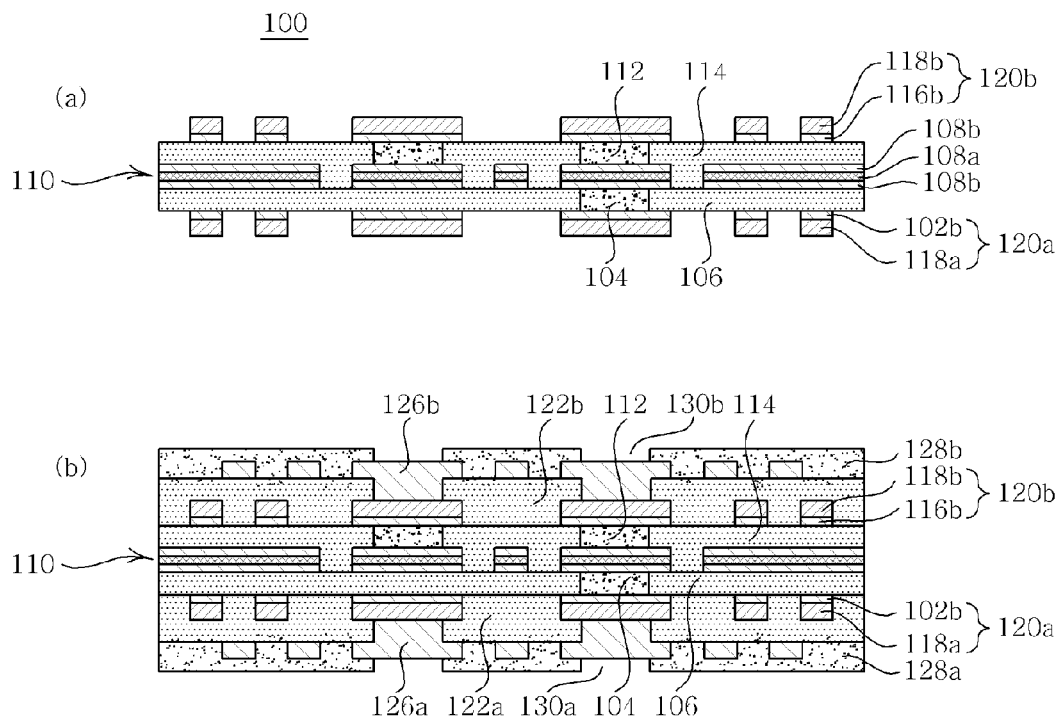
FIG. 6 shows sectional views of heat dissipating substrates according to an embodiment of the present invention.

FIG. 6 shows sectional views of heat dissipating substrates according to an embodiment of the present invention. Here, FIG. 6A is a sectional view of a two-layered heat dissipating substrate, and FIG. 6B is a sectional view of a four-layered heat dissipating substrate. Hereinafter, a heat dissipating substrate 100 according to an embodiment of the present invention will be described with reference to FIG. 6.

As shown in FIG. 6A, the two-layered heat dissipation substrate 100 according to this embodiment has a structure including: a heat dissipating circuit layer 110 composed of an electrolytic invar layer including an invar layer 108a and electrolytic copper plating layers 108b formed on both sides of the invar layer 108a; insulation layers 106 and 114 covering the heat dissipating circuit layer 110; first and second circuit layers 120a and 120b respectively connected with the insulation layers 106 and 114 through first and second bumps 104 and 112.

Here, the heat dissipating circuit layer 110 is formed of an electrolytic invar layer, having a low thermal expansion coefficient, including an invar layer 108a and electrolytic copper plating layers 108b formed on both sides of the invar layer 108a such that it has high thermal conductivity to increase heat dissipation efficiency and can perform an buffering action to prevent the heat dissipating substrate 100 from warping by the discordance of thermal expansion coefficients between the heat dissipating circuit layer 110 and the semiconductor chips connected with the first and second circuit layers 120a and 120b. In this case, since the thickness of the invar layer 108a and/or the electrolytic copper plating layers 108b can be controlled, it is possible to realize a heat dissipating substrate which is thinner than conventional metal core substrates.

The insulation layers 106 and 114 include a first insulation layer 106 formed on one side of the heat dissipating circuit layer 110 and a second insulation layer 114 formed in the space thereof and on the other side thereof.

The circuit layers 120a and 120b include a first circuit layer 120a formed on the first insulation layer 106 and a second circuit layer 120b formed on the second insulation layer 114. Here, the first circuit layer 120a includes a first metal layer 102 and a first plating layer 118a, and the second circuit layer 120b includes a second metal layer 116 and a second plating layer 118b. In a manufacturing process, when an electrolytic copper plating layer, which is a part of an electrolytic invar layer, is employed as the first metal layer 102, the first plating layer 118a is also formed of an electrolytic copper plating layer, so that the first circuit layer 120a has a structure including two electrolytic copper plating layers. The second circuit layer 120b also has the same structure as the first circuit layer 120a. Meanwhile, such a circuit layer structure is an example of circuit layer structures formed by a modified semi-additive process, and circuit layer structures formed by other well-known circuit layer forming processes can also be included in the scope of the present invention.

Further, the heat dissipating substrate 100 according to this embodiment may further include solder resist layers which protect the circuit layers 120a and 120b and which have openings for exposing pads brought into contact with connecting terminals, such as solder balls, of the circuit layers 120a and 120b.

Meanwhile, FIG. 6B shows a four-layered heat dissipating substrate. That is, the four-layered heat dissipating substrate may have a four-layered structure in which buildup layers including outer insulation layers 122a and 122b and outer circuit layers 126a and 126b are formed on both sides of the heat dissipating substrate shown in FIG. 6A and solder resist layers 128a and 128b for protecting the outer circuit layers 126a and 126b are formed on the buildup layers. In this case, the solder resist layers 128a and 128b are provided with openings 130a and 130b for exposing pads of the outer circuit layers 126a and 126b.

FIGS. 7 to 17 are sectional views showing a method of manufacturing a heat dissipating substrate according to an embodiment of the present invention. Hereinafter, the method of manufacturing a heat dissipating substrate according to this embodiment will be described with reference to FIGS. 7 to 17.

Figure 7:
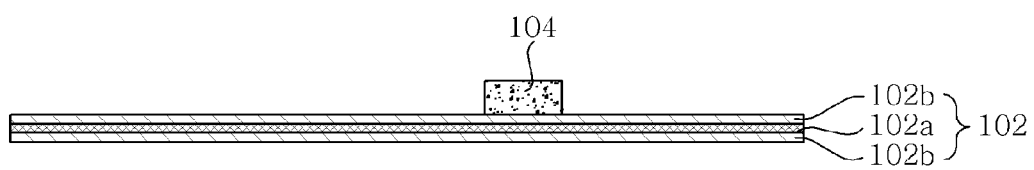
FIGS. 7 to 17 are sectional views showing a method of manufacturing a heat dissipation substrate according to an embodiment of the present invention.

First, as shown in FIG. 7, a first bump 104 is formed on one side of a first metal layer 102.

In this case, the first metal layer 102, which serves to support the first bump 104 and functions as a seed layer for electrolytic copper plating when performing an electrolytic copper plating process in order to form a first circuit layer 120a, may be made of a material having predetermined strength and conductivity. For example, the first metal layer 102 may be an electrolytic invar layer including an invar layer 102a made of invar having high thermal conductivity and a low thermal expansion coefficient and electrolytic copper plating layers 102b formed on both sides of the invar layer 102a. Further, the first metal layer 102 may be surface-roughened using buffing, plasma or ion beam machining, oxide treatment, Czochralski (Cz) treatment or the like in order to increase the adhesion between the first metal layer 102 and the first bump 104 or a first insulation layer 106.

Meanwhile, the first bump 104 is formed using a screen printing method of transferring conductive paste using a mask having an opening. That is, the first bump 104 is formed on the first metal layer 102 by applying conductive paste onto a mask and then extruding the conductive paste through an opening of the mask using a squeegee. Here, the conductive paste used to form the first bump 104 may be made of a conductive material, such as Ag, Pd, Pt, Ni or Ag/Pd.

Figure 8:
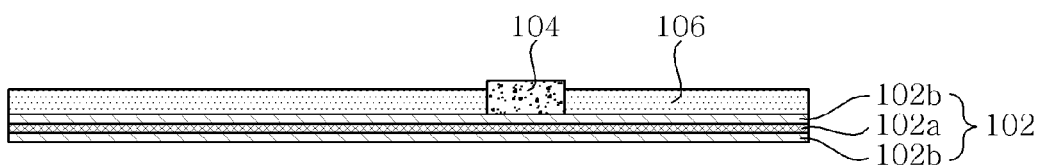

Subsequently, as shown in FIG. 8, a first insulation layer 106 is formed on the first metal layer 102 such that the first bump 104 pierces the first insulation layer 106.

In this case, the thickness of the first insulation layer 106 may be smaller than the height of the first bump 104. For example, the first insulation layer 106 may be formed such that the first bump 104 is exposed over the first insulation layer 106 by about 10~50 μm. Further, in order to increase heat dissipation efficiency, the first insulation layer 106 may have a structure in which an inorganic filler having excellent thermal conductivity, such as alumina ($Al_2O_3$), aluminum nitride (AlN) or boron nitride (BN), is dispersed in an insulating resin. Furthermore, in order to improve the flexural characteristics of a heat dissipating substrate, the first insulation layer 106 may be formed of prepreg including woven glass fiber.

Meanwhile, the first insulation layer 106 may be formed by a contact method or a noncontact method. In the contact method, the first insulation layer 106 is formed by piercing the prepreg with the first bump 104, and in the noncontact method, the first insulation layer 106 is formed by coating the first metal layer 102 with insulating resin powder using an ink-jet printing method. In this case, the noncontact method is advantageous in that the change in shape of the first bump 144 occurring when the first bump 104 pierces the first insulation layer 106 using the contact method or the gap between the first bump 104 and the first insulation layer 106 can be minimized.

Figure 9:
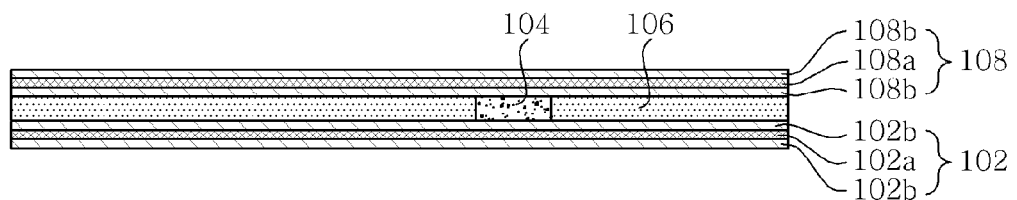

Subsequently, as shown in FIG. 9, a metal foil 108 is formed on the first insulation layer 106 such that the metal foil 108 is brought into contact with the metal bump 104. Here, the metal foil 108 may be an electrolytic invar layer including an invar layer 108a and electrolytic copper plating layers 108b formed on both sides of the invar layer 108a. When the metal foil 108 having such a structure is employed, the thickness of the electrolytic copper plating layers 108b can be easily controlled, it is possible to realize a heat dissipating substrate thinner than conventional metal core substrates.

In this case, the metal foil 108 may be formed on the first insulation layer 106 by pressing it using a press plate, such as a flat stainless plate or the like, while heating the first insulation layer 106 to a softening temperature or higher in vacuum.

Figure 10:
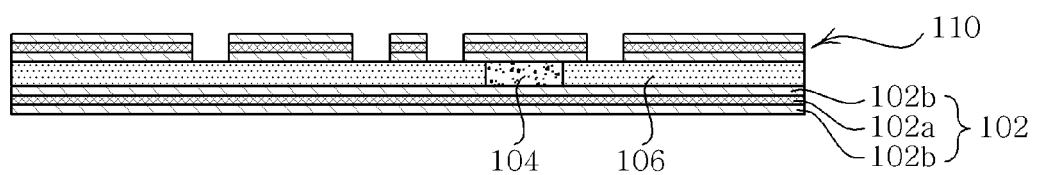

Subsequently, as shown in FIG. 10, the metal foil 108 is patterned to form a heat dissipating circuit layer. In this case, the heat dissipating circuit layer 110, differently from the conventional metal core (see 11 of FIG. 1) embedded in the insulation layer 13 to perform only a heat dissipation function, performs not only the heat dissipation function but also a function of a ground or signal line.

Figure 11:
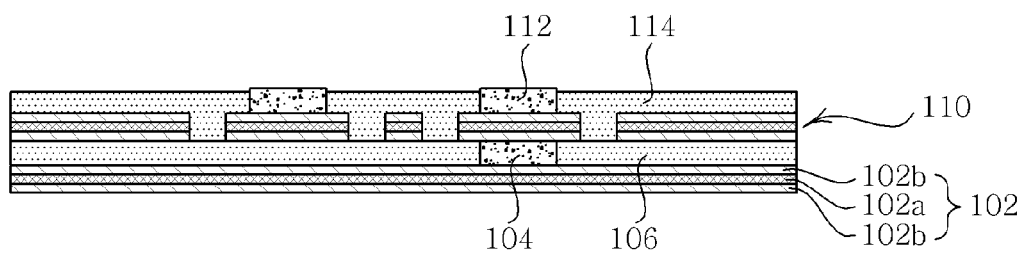

Subsequently, as shown in FIG. 11, a second bump 112 is formed on the heat dissipating circuit layer 110, and then a second insulation layer 114 is formed on the heat dissipating circuit layer 110 such that the second bump 112 pierces the second insulation layer 114. Here, the second bump 112 is formed using the same method as used in the formation of the first bump 104, and the second insulation layer 114 is formed using the same method as used in the formation of the first insulation layer 106, so a redundant description thereof will be omitted.

Figure 12:
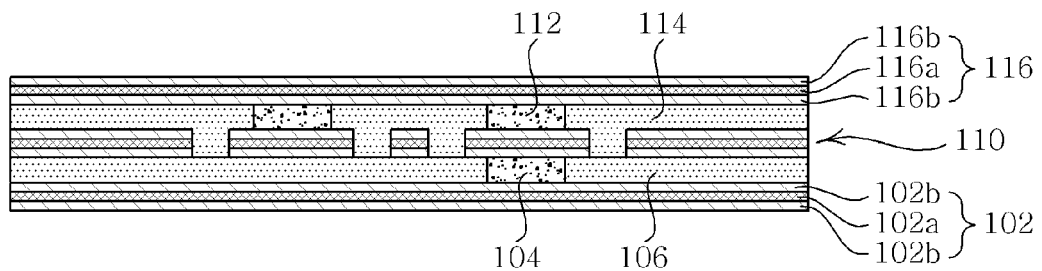

Subsequently, as shown in FIG. 12, a second metal layer 116 is formed on the second insulation layer 114 such that the second metal layer 116 is brought into contact with the second bump 112.

In this case, the second metal layer 116 may be an electrolytic invar layer including an invar layer 116a and electrolytic copper plating layers 116b formed on both sides of the invar layer 116a. Meanwhile, the second metal layer 116 may be formed on the second insulation layer 114 by pressing it using a press plate, such as a flat stainless plate or the like, while heating the second insulation layer 114 to a softening temperature or higher in vacuum.

Figure 13:
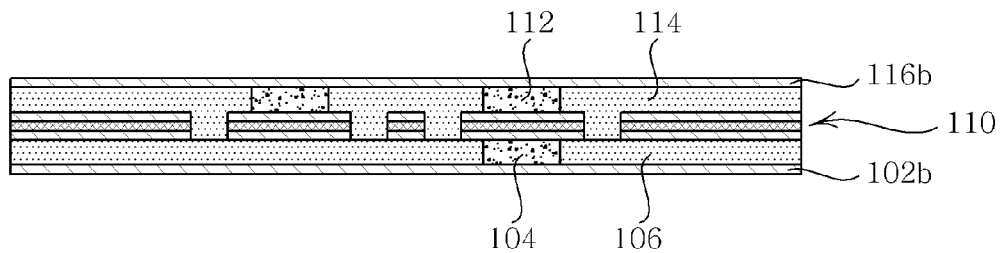

Subsequently, as shown in FIG. 13, a process of decreasing the thicknesses of the first metal layer 102 and the second metal layer 116 is performed. Here, since the first metal layer 102 and the second metal layer 116 partially constitute a first circuit layer 120a and a second circuit layer 120b, respectively, it is possible to realize a microcircuit by increasing the thicknesses thereof. For example, when the first metal layer 102 includes an invar layer 102a and electrolytic copper plating layers 102b formed on both sides of the invar layer 102a and the second metal layer 116 includes an invar layer 116a and electrolytic copper plating layers 126b formed on both sides of the invar layer 116a, the thicknesses of the first metal layer 102 and the second metal layer 116 can be decreased by removing the electrolytic copper plating layer 102b formed on one side of the invar layer 102a and the electrolytic copper plating layer 116b formed on one side of the invar layer 116a using etching. Meanwhile, when thin copper foil layers are used as the first metal layer 102 and the second metal layer 116, this process may be omitted.

Figure 14:
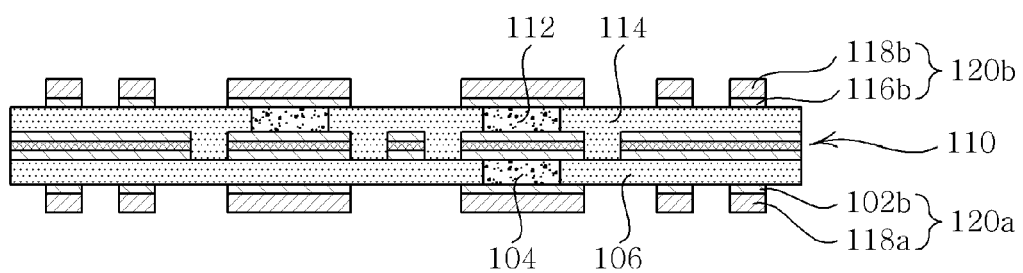

Subsequently, as shown in FIG. 14, the first metal layer 102 and the second metal layer 116 are electrolytic-plated to form a first plating layer 118a on the first metal layer 102 and to form a second plating 118b on the second metal layer 116, and then the first metal layer 102 and the first plating layer 118a are patterned to form a first circuit layer 120a, and the second metal layer 116 and the second plating layer 118b are patterned to form a second circuit layer 120b. In this case, since the first plating layer 118a and the second plating layer 118b are respectively formed on the first metal layer 102 and the second metal layer 116 which function as seed layers, only an electrolytic copper plating process is performed without performing an additional electroless plating process. Meanwhile, when the electrolytic copper plating layer 102b, which is a part of an electrolytic invar layer, is used as the first metal layer 102, the first circuit layer 120a includes two electrolytic copper plating layers because it is composed of the electrolytic copper plating layer 102b and the first plating layer 118a which is an electrolytic copper plating layer. Further, when the electrolytic copper plating layer 116b, which is a part of an electrolytic invar layer, is used as the second metal layer 116, the second circuit layer 120b also includes two electrolytic copper plating layers because it is composed of the electrolytic copper plating layer 116b and the first plating layer 118b which is an electrolytic copper plating layer.

Meanwhile, in order to realize a microcircuit, a semi-additive process (SAP), in which both the first metal layer 102 and the second metal layer 116 are removed by etching, the first insulation layer 106 and the second insulation layer 114 are surface-treated by desmearing, seed layers are formed on the surface-treated insulation layers 106 and 114 by chemical copper plating or sputtering, and then circuit layers are formed by electroless copper plating, can be used, and is included in the scope of the present invention.

Meanwhile, although FIG. 14 shows a two-layered heat dissipating substrate, a multi-layered heat dissipating substrate can be manufactured using this two-layered heat dissipating substrate. Hereinafter, a method of manufacturing a multi-layered (for example, four-layered) heat dissipating substrate will be described with reference to FIGS. 15 to 18.

Figure 15:
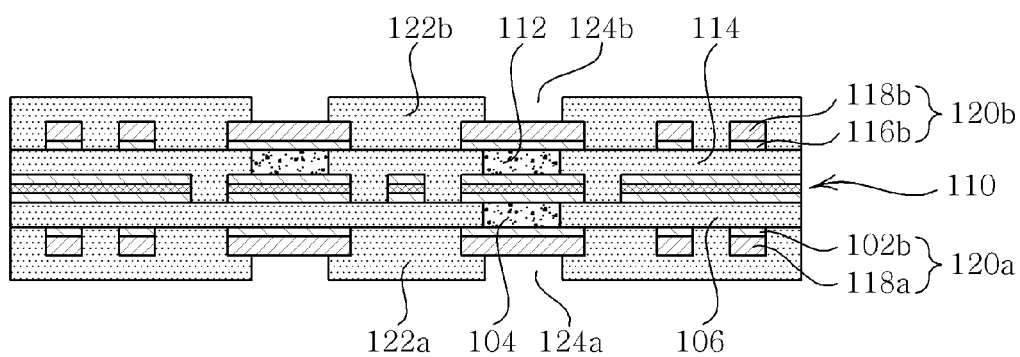

As shown in FIG. 15, a first outer insulation layer 122a is formed on the first insulation layer 106 including the first circuit layer 120a formed thereon, and a second outer insulation layer 122b is formed on the second insulation layer 114 including the second circuit layer 120b formed thereon, and then first and second viaholes 124a and 124b for making interlayer connections are formed in the first and second outer insulation layers 122a and 122b, respectively.

Figure 16:
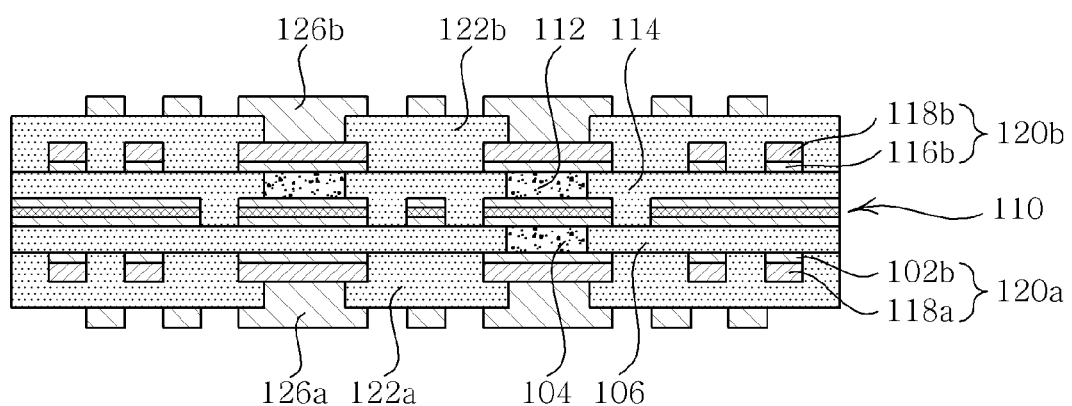

Subsequently, as shown in FIG. 16, a plating process is performed on the first and second outer insulation layers 122a and 122b and in the first and second viaholes 124a and 124b to form plating layers, and then the plating layers are patterned to form first and second outer circuit layers 126a and 126b including vias.

Figure 17:
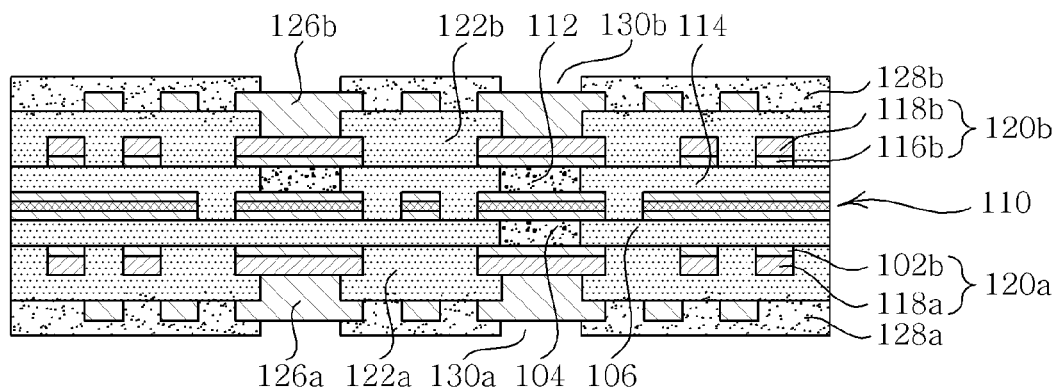

Finally, as shown in FIG. 17, first and second solder resist layers 128a and 128b are formed on the first and second outer insulation layers 122a and 122b including the first and second outer circuit layers 126a and 126b formed thereon, and then first and second openings 130a and 130b for exposing pads of the first and second outer circuit layers 126a and 126b are formed in the first and second solder resist layers 128a and 128b to manufacture a four-layered heat dissipating substrate. In this case, the pads may be provided with bumps allowing the pads to be easily connected with semiconductor chips by printing solder paste thereon. Here, the solder paste may be made of lead-tin solder or lead-free solder (SAC305).

Meanwhile, it will be obvious that a heat dissipating substrate of more than four layers also can be manufactured using the above method.

As described above, according to the heat dissipating substrate of the present invention, since a heat dissipating circuit layer, which is formed of an electrolytic invar layer including an invar layer having high thermal conductivity and low thermal expansion coefficient and electrolytic copper plating layers formed on both sides of the invar layer, is used instead of a metal core, the heat dissipating substrate not only can exhibit excellent heat dissipation performance but also can minimize its bendability attributable to the difference of thermal expansion coefficient.

Further, according to the present invention, the thicknesses of the electrolytic plating layers of an electrolytic invar layer are controlled, so that the thickness of the entire substrate can also be decreased, thereby increasing the accuracy with which holes are formed and enabling a substrate to be thin.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

Simple modifications, additions and substitutions of the present invention belong to the scope of the present invention, and the specific scope of the present invention will be clearly defined by the appended claims.

What is claimed is:

1. A heat dissipating substrate, comprising:
   a heat dissipating circuit layer formed of an electrolytic invar layer including an invar layer and electrolytic copper plating layers formed on both sides of the invar layer;
   insulation layers formed on both sides of the heat dissipating circuit layer such that the heat dissipating circuit layer is interposed between the insulation layers;
   first and second circuit layers formed on the insulation layers; and
   a first bump having substantially uniform diameter connecting the heat dissipating circuit layer with the first circuit layer and a second bump having substantially uniform diameter connecting the heat dissipating circuit layer with the second circuit layer,
   wherein the invar layer of the heat dissipating circuit layer and the electrolytic copper plating layers are equally patterned.

2. The heat dissipating layer according to claim 1, further comprising:
   a first outer insulation layer and a first outer circuit layer formed on one side of the insulation layer including the first circuit layer formed thereon; and
   a second outer insulation layer and a second outer circuit layer formed on one side of the insulation layer including the second circuit layer formed thereon.

* * * * *